United States Patent [19]

Jacobson

[11] Patent Number: 4,715,034
[45] Date of Patent: Dec. 22, 1987

[54] METHOD OF AND SYSTEM FOR FAST FUNCTIONAL TESTING OF RANDOM ACCESS MEMORIES

[75] Inventor: David M. Jacobson, Seattle, Wash.

[73] Assignee: John Fluke Mfg. Co., Inc., Everett, Wash.

[21] Appl. No.: 708,749

[22] Filed: Mar. 4, 1985

[51] Int. Cl.$^4$ .............................................. G06F 11/26
[52] U.S. Cl. ........................................ 371/21; 371/25; 365/201
[58] Field of Search ................. 371/21, 24, 25, 27; 364/200 MS File, 900 MS File; 365/201

[56] References Cited

U.S. PATENT DOCUMENTS

| | | | |
|---|---|---|---|
| 3,579,199 | 5/1971 | Anderson | 377/21 X |
| 3,719,929 | 3/1973 | Fay | 371/21 X |
| 3,924,181 | 12/1975 | Alderson | . |
| 4,061,908 | 12/1977 | de Jonge | 371/21 |
| 4,195,770 | 4/1980 | Benton | 371/24 X |
| 4,342,084 | 7/1982 | Sager | 371/21 X |
| 4,380,068 | 4/1983 | de Couasnon | 371/21 X |
| 4,414,665 | 11/1983 | Kimura | 365/201 X |
| 4,429,389 | 1/1984 | Catiller | . |
| 4,442,519 | 4/1984 | Jones | 371/27 |

FOREIGN PATENT DOCUMENTS

| | | |
|---|---|---|
| 0108255 | 5/1984 | European Pat. Off. . |
| 0108256 | 5/1984 | European Pat. Off. . |
| 156571 | 9/1982 | Japan ................................... 371/21 |
| 1363786 | 8/1974 | United Kingdom . |
| 2047413 | 11/1978 | United Kingdom . |
| 2001178 | 1/1979 | United Kingdom . |
| 2028517 | 3/1980 | United Kingdom . |

OTHER PUBLICATIONS

D. G. East, "Address Generation for Array Testing", IBM Technical Disclosure Bulletin, vol. 21, No. 12, 5/1979, p. 4942.

W. H. McAnney, J. Savir, & S. R. Vecchio, "Random Pattern Testing for Data-Line Faults in an Embedded Multiport Memory", paper 3.3, 1985, International Test Conference, IEEE, 1985.

J. Savir, W. H. McAnney, & S. R. Vecchio, "Random Pattern Testing for Address-Line Faults in an Embedded Multiport Memory", paper 3.4, 1985, International Test Conference, IEEE 1985.

J. Savir, G. S. Ditlow, P. H. Bardell, "Random Pattern Testability, IEEE Transactions on Computers, vol. C-33, No. 1, Jan. 1984.

J. Savir, P. H. Bardell, "On Random Pattern Test Length", IEEE Transactions on Computers, vol. C-33, No. 6, Jun. 1984.

Primary Examiner—Jerry Smith
Assistant Examiner—Robert W. Beausoliel, Jr.
Attorney, Agent, or Firm—Stephen A. Becker

[57] ABSTRACT

Random bits are written successively into the cells of a random access memory (RAM) system, then complemented, through a first sequence of cell addresses distributed substantially uniformly throughout all the cells of the memory. Through an opposite address sequence, the contents of the cells are read and then complemented. Finally, through the initial sequence of cell addresses, the contents of the cells are again read. Differences between read and expected cell contents identify memory cell faults. The random bits preferably are generated by a softward implemented, reversible pseudorandom sequence generator, and the uniform address sequence is generated by an address hasher programmed with an address function that exercises all address lines essentially equally.

24 Claims, 6 Drawing Figures

| $Z(i)\ Z(j)$ operation | 0 $M_i$ | 0 $M_j$ | 0 $M_i$ | 1 $M_j$ | 1 $M_i$ | 0 $M_j$ | 1 $M_i$ | 1 $M_j$ |
|---|---|---|---|---|---|---|---|---|
| $M_i \leftarrow Z(i)$ | 1! | 1* | 1! | 1* | 0! | 0* | 0! | 0* |
| $M_i \leftarrow \overline{Z(i)}$ | 0! | 0* | 0! | 0* | 1! | 1* | 1! | 1* |
| $M_j \leftarrow \overline{Z(j)}$ | 0 | 1! | 0 | 0! | 1 | 1! | 1 | 0! |
| $M_j \leftarrow Z(j)$ | 0 | 0! | 0 | 1! | 1 | 0! | 1 | 1! |
| $M_j \stackrel{?}{=} Z(j)$ | 0 | 0? | 0 | 1? | 1 | 0? | 1 | 1? |
| $M_j \leftarrow \overline{Z(j)}$ | 0 | 1! | 0 | 0! | 1 | 1! | 1 | 0! |
| $M_i \stackrel{?}{=} Z(i)$ | 0? | 1 | 0? | 0 | 1? | 1 | 1→0?# | 0 |
| $M_i \leftarrow \overline{Z(i)}$ | 1! | 1 | 1! | 1* | 0! | 0* | 0! | 0 |
| $M_i \stackrel{?}{=} \overline{Z(i)}$ | 1? | 1 | 1? | 1* | 0? | 0* | 0? | 0 |
| $M_j \stackrel{?}{=} \overline{Z(j)}$ | 1 | 1? | 1 | 1*?# | 0 | 0?# | 0 | 0? |

Fig. 3

| $Z(i)\ Z(j)$ operation | 0 $M_i$ | 0 $M_j$ | 0 $M_i$ | 1 $M_j$ | 1 $M_i$ | 0 $M_j$ | 1 $M_i$ | 1 $M_j$ |
|---|---|---|---|---|---|---|---|---|
| $M_i \leftarrow Z(i)$ | 1! | x | 1! | x | 0! | x | 0! | x |
| $M_i \leftarrow \overline{Z(i)}$ | 0! | x | 0! | x | 1! | x | 1! | x |
| $M_j \leftarrow \overline{Z(j)}$ | 0 | 1! | 0 | 0! | 1 | 1! | 1 | 0! |
| $M_j \leftarrow Z(j)$ | 0 | 0! | 0 | 1! | 1 | 0! | 1 | 1! |
| $M_j \stackrel{?}{=} Z(j)$ | 0 | 0? | 0 | 1? | 1 | 0? | 1 | 1? |
| $M_j \leftarrow \overline{Z(j)}$ | 0 | 1! | 0 | 0! | 1 | 1! | 1 | 0! |
| $M_i \stackrel{?}{=} Z(i)$ | 0:1?# | 1 | 0? | 0 | 1? | 1 | 1 | 0 |
| $M_i \leftarrow \overline{Z(i)}$ | 1! | 1 | 1! | 0 | 0! | 1 | 0! | 0 |
| $M_i \stackrel{?}{=} \overline{Z(i)}$ | 1? | 1 | 1? | 0 | 0:1?# | 1 | 0? | 0 |
| $M_j \stackrel{?}{=} \overline{Z(j)}$ | 1 | 1? | 1 | 0? | 0 | 1 | 0 | 0? |

Fig. 4

| $Z(i)\ Z(j)$ operation | 0 $M_i$ | 0 $M_j$ | 0 $M_i$ | 1 $M_j$ | 1 $M_i$ | 0 $M_j$ | 1 $M_i$ | 1 $M_j$ |
|---|---|---|---|---|---|---|---|---|
| $M_i \leftarrow Z(i)$ | 1! | x | 1! | x | 0! | x | 0! | x |
| $M_i \leftarrow \overline{Z(i)}$ | 0! | x | 0! | x | 1! | 1* | 1! | 1* |
| $M_j \leftarrow \overline{Z(j)}$ | 0 | 1! | 0 | 0! | 1 | 1! | 1 | 0! |
| $M_j \leftarrow Z(j)$ | 0 | 0! | 1* | 1! | 1 | 0! | 1 | 1! |
| $M_j \stackrel{?}{=} Z(j)$ | 0 | 0? | 1*# | 1? | 1 | 0? | 1 | 1? |
| $M_j \leftarrow \overline{Z(j)}$ | 0 | 1! | 0 | 0! | 1 | 1! | 1 | 0! |
| $M_i \stackrel{?}{=} Z(i)$ | 0? | 1 | 0? | 0 | 1? | 1 | 1 | 0 |
| $M_i \leftarrow \overline{Z(i)}$ | 1! | 1 | 1! | 1* | 0! | 1 | 0! | 0 |
| $M_i \stackrel{?}{=} \overline{Z(i)}$ | 1? | 1 | 1? | 1* | 0? | 1 | 0? | 0 |
| $M_j \stackrel{?}{=} \overline{Z(j)}$ | 1 | 1? | 1 | 0*?# | 0 | 1 | 0 | 0? |

METHOD OF AND SYSTEM FOR FAST FUNCTIONAL TESTING OF RANDOM ACCESS MEMORIES

TECHNICAL FIELD

The invention relates generally to functional testing of random access memory systems, and more particularly, toward a probabilistic method of and system for detecting faults in memory systems using a fast functional test algorithm having a high degree of reliability.

BACKGROUND ART

Figure 1:
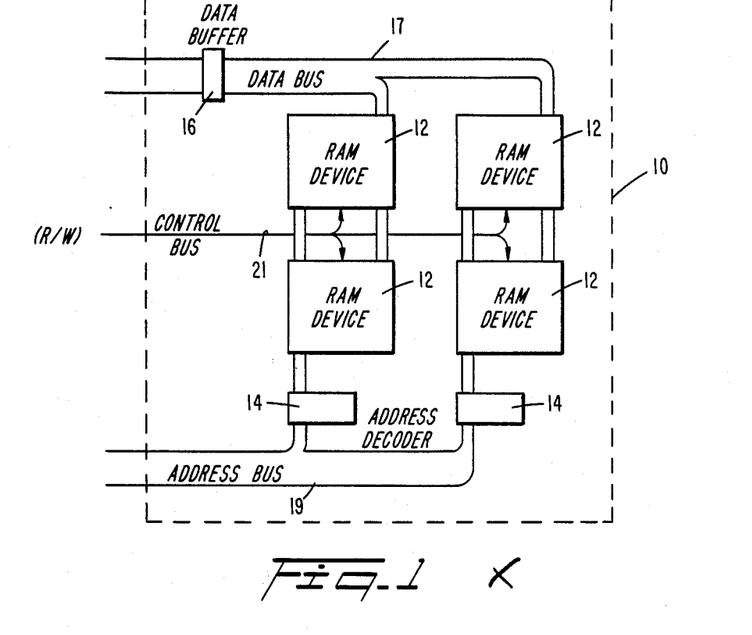
FIG. 1 is a block diagram of a conventional random access memory (RAM) system of a type to be tested in accordance with the invention.

Recent developments in semiconductor memory technology have substantially increased the use of semiconductor random access memories (RAMs) which usually are large scale integration (LSI) devices employing either bipolar or metal oxide semiconductor (MOS) techniques. A RAM system 10 shown schematically in FIG. 1 consists mainly of a number of memory devices 12, address decoders 14, and data buffer 16 connected on data and address buses 17, 19. Each memory device or chip 12 contains a number of memory cells organized in words and capable of being writen into as well as read from. Read/write (R/W) signals are applied to the RAM devices 12 through control bus 21.

Physical faults, which can occur in any part of the memory chip, depend on such factors as component density, circuit layout and method of manufacture. Test procedures necessary to detect these faults are classified into three classes, DC parametric testing, AC parametric testing and functional testing.

In DC parametric testing, DC parameters in the chip are checked for unacceptable output levels, high power consumption, fanout capability, noise margins, rise and fall times of logical signals and other factors. AC parametric testing, or dynamic testing, measures AC parameters, such as memory access time, set up time, and hold time, to detect any malfunction. Examples of malfunctions that can be detected by AC testing include "slow write-recovery" where the memory does not produce the correct information at the specified access time when each read cycle is preceded by a write cycle, and "sleeping sickness" where the memory loses information in less than the specified hold time.

Functional testing detects permanent faults that cause the memory to function incorrectly. Generally, a read/write RAM can be defined as functional or operative if the value read from any cell matches the value most recently written to that cell, and does not depend on the value written to, or the contents of any other cells.

A functional test that will cover all the possible faults is impractical since the complexity of such a test will be on the order of $2^n$, where n is the number of cells in the memory. This is because each cell for all possible states of the remaining cells must be monitored during a measurement cycle. Thus, to test a 1 kilobit RAM, assuming a cell access time of 500 nanoseconds, would require approximately $10^{293}$ seconds. To develop any practically feasible test procedure, therefore, the test must be concerned not with all possible faults but only with the subset of faults that is most likely to occur. This is known as fault modeling.

The model upon which the test in accordance with the invention is based assumes very little about the layout of the chips under test, or even about which address lines select chips and which select bits within chips. The model is based on a hierarchy of memory devices, beginning at the lowest level with cells within a chip. The next level is the chips per se, followed by a board of chips. The highest level is the complete system under test. Each level of the hierarchy has associated with it a subset of address bits that select among its constituent components. Levels of the hierarchy are organized into rows and columns, with separate address bits controlling each. The model includes memory systems organized into words. At the upper levels of the hierarchy, it is typical for a full word to reside in a component, i.e., a board will usually contain a full word. For example, a system with 16 bit words consisting of one or more boards with a number of $16K \times 1$ chips has all the bits on each board, but there is a separate chip for each bit of the word. On the other hand, a system could be constructed from $2K \times 8$ chips, having 8 different data bits on each chip.

The model includes the following faults:
1. Stuck RAM cells. This occurs when a cell is always either a 1 or a 0. In one type, a cell might power up in some state, and be capable of being read, but once transitioned to the opposite state, cannot be further changed. In another type, known as a transition fault, the cell appears stuck-at relative to write operations addresses to it, but might still be changed due to a simultaneously occurring coupling fault.
2. Stuck address bits. This fault maps two sets of addresses together. If the fault is at a level in the hierarchy where each component contains a full word, all bits of the words will be affected.
3. Faulty decoder. Here, a row or column decoder either fails to select when it should or selects when it should not. The first case will result in a read returning 0s or 1s, depending upon the memory design, while writes will be ineffective. Multiple selection causes writes to affect memory cells. At levels higher than the chip level, multiple selection during a read will non-destructively AND or OR multiple cells depending upon the memory design. The same may be true for multiple column selection at the chip level, depending on the design of the particular memory chip. If multiple rows in a chip are selected and the affected cells do not all contain the same value, a read will return an undetermined value and the affected cells will be set to that value. This fault will also cause the data to be destroyed during refresh cycles.
4. Stuck data register bit. This fault causes the same bit of all words in the affected component of the memory system to appear stuck.
5. Shorted or pattern sensitive data register bits. Here, it is impossible to write words with some particular pattern in some set of data bits, and affects all subordinate components in the memory hierarchy.
6. Static coupling faults. In this fault type, two cells are coupled to each other such that one or more of the four possible states of the cells are prohibited. A special case is aliasing, in which the 01 and 10 states are prohibited. In addition, a write to a cell always succeeds, affecting other cells as well. Inverted aliasing is always possible, wherein the prohibited states are 00 and 11. In a static memory wherein cells are built from flipflops, this could arise from coupling between the true side of one flipflop and the false side of a neighboring flipflop.

Coupling faults must be within cells of the same chip.
7. Dynamic coupling faults. Herein, the setting of one cell may change, either setting or clearing, some other cell. This need not be symmetric.
8. Pattern sensitive faults. This type of fault makes it impossible to write some pattern into a group of adjacent cells.
9. Address to data shorts. This type of fault appears as either stuck data bits, when the address line overwhelms the data line, or as dynamic coupling to some other address, when the data line overwhelms the address line.
10. Shorts between address or data lines and the R/W line. Herein, if a data or address is forced to the wrong state, a stuck address bit or a stuck data register bit will appear. If the R/W line is forced to a write when a read is requested, the memory does not return a value, and the value read wll be some fixed value (typically all 1s or all 0s) depending on the construction of the memory system.

In a Galpat test, into a background of 0s, the first cell (test cell) is complemented and then read alternately with every other cell in memory. The sequence continues as every memory cell eventually becomes the test cell. The system then executes the same sequence using complemented data. Galpat has an execution time proportional to the square of the cell count, but misses many faults.

A march test is one that sequences through a set of addresses doing the same thing at each address. In one type of standard march test, after writing a background of 0s to memory, the system reads the data at the first address and writes a 1 therein. The same two-step read/write procedure continues at each sequential cell until the system reaches the end of memory; each cell is then tested and changed back to 0 in reverse order until the system returns to the first address. Finally, the test is repeated using complemented data. In another type of march test, rather than writing the same bit into all cells, a fixed pattern of bits derived by applying a hash function to the address is written successively into the cells.

Any march test of either type that does exhaustive testing for coupling faults, including asymmetric and inverted coupling, in a $1 \times n$ memory that is assumed to have no transition faults, stuck-at faults or multiple access decoding faults, however, requires at least 14n operations. See Suk and Reddy, IEEE Transactions On Computers, Vol. C-30, No. 12, December 1981, pp. 982-985.

Decoder faults are manifest as coupling faults between corresponding cells in the affected rows. A standard march test of any order, using the same value at all addresses, will miss all faults of a given class on the affected row if it misses any of that class. Using a fixed sequence can improve such an algorithm by increasing the likelihood that corresponding cells are exercised in all possible combinations. For example, in a fixed sequence RAM short test used in the 9000 series instrumentation manufactured by John Fluke Mfg. Co., a sweep is made up the memory writing a value to each word location. In a second sweep, the value is compared to an expected value. The value written at each location is obtained by folding the address into a word which is the width of the data bus, and complementing and rotating the folded word if the address has odd parity. The bits of the resulting word depend approximately equally on every bit of the address, making the test suitable to detect aliasing caused by a short on any address line leading to the decoder, and affecting any data bit. Nevertheless, the set of combinations used is fixed by the sequence. While there may exist a sequence that will find decoder faults for a particular memory configuration, it is possible to construct a configuration that renders any given sequence ineffective.

Let TUk denote the operation of toggling a memory location k times, beginning with an up (0 to 1) transition, and TDk denote the corresponding thing starting with a down transition; a T without a following U or D designates a first transition that may be either up or down. Suk and Reddy show that any such test must contain the following. Going up (in addresses) $RTUk_1$ ($k_1 \geq 2$) going up $RTDk_2$ ($k_2 \geq 2$), going down $RTUk_3$ ($k_3 \geq 2$), going down $RTDk_4$ ($k_4 \geq 2$). Furthermore, either $k_1 > 2$ or $k_2 > 2$ or another sequence of the form going up $RTk_5$ ($k_5$ odd) must appear. Similarly, $k_3 > 2$ or $k_4 > 2$ or a sequence of the form going down $RTk_6$ ($k_6$ odd) must appear.

Suk and Reddy propose a 14N test, called Test A, that will find all stuck-at faults, transition faults, and multiple access decoding faults or all coupling faults. It assumes that the memory is initialized to all 0s, and contains the following sequences: going up RWcWcWc, going up RWcWc, going down RWcWcWc, going down RWcWc. Any march test of order less than 14n, however, will not detect all isolated coupling faults.

Suk and Reddy further propose a 16N test, called Test B, that finds all combinations of stuck-at faults, transition faults and coupling faults if no multiple access decoding faults are present. Test B consists of the following sequences: going up RWcRWcRWc, going up RWcWc, going down RWcWcWc, going down RWcWc. This test, preceded by a pass to intialize the memory to 0s, probably finds all combinations of stuck-at faults, transition faults, coupling faults and multiple access decoder faults.

A 30N test, developed by Nair, Thatte and Abraham, has the following sequences, where W0 and W1 indicate a write 0 and 1, respectively: going up W0, going up RW1, going down R, going up RW0, going down R, going down RW1, going up R, going down RW0, going up R, going up RW1W0, going down R, going down WR1W0, going up R, going up W1, going up WR0W1, going down R, going down RW0W1, going up R.

The above and other types of tests are summarized in Abadair and Reghbati, Functional Testing of Semiconductor Random Access Memories, Computing Surveys, Vol. 15, No. 3, September 1983, pp. 175-198.

Each of the aforementioned tests, as well as of others of which I am aware, requires a testing time that is impracticably long or else is unreliable because it tends to miss faults or certain classes of faults.

A primary object of the invention, is to provide functional testing of random access memories in as short a time as possible while identifying the most common faults, i.e., stuck data cells, defective decoders, defective address or data registers and faults between address and data lines.

Another object of the invention, is to provide a method of and system for testing memory faults in a random access memory, with a high probability of identifying coupling faults and decoder faults, all of which affect a number of different addresses.

A further object of the invention is to provide a method of and system for maximizing the likelihood of identifying memory faults using a memory test algorithm that requires as short a testing time as possible.

DISCLOSURE OF INVENTION

A method of fault testing random access memory systems comprises writing random bits successively into all the cells of the array, reading the bits and, in response, identifying any memory faults. Whereas many faults, such as decoder faults, affect a large number of cell pairs, at minimum the number of cells in a row or column, and whereas the probability when writing random data to all cells of failing to write a combination of bits that will reveal a fault at a single cell pair is at most 0.75, the probability of failing to detect the fault at all affected cell pairs is at most $0.75^k$, where k is the number of affected cell pairs. Thus, if a column has 32 cells, for example, the probability of missing a fault manifest as a set of dynamic coupling faults and thereby failing to report an error, is $0.75^{32}$ or 0.0001004.

In accordance with another aspect of the invention, the method involves writing random bits, followed by their complements, successively into the cells through one sequence of cell addresses. The contents of the cells are then, through an opposite address sequence, read and compared to first expected contents, then rewritten again complemented. Finally, the contents of the cells through the address sequence are read and compared to second expected contents. Memory faults are identified as a result of the comparisons.

The apparatus comprises a reversible pseudorandom number generator fashioned either from hardware using, for example, recirculating shift registers, or by software, to generate random bit sequences. The generator is of a reversible type to enable the chip to be selectively up addressed or down addressed during writing of a sequence with the memory for carrying out the bidirectional testing sequence. The generator thus generates the same pseudorandom sequence for each particular initial setting of the contents of the generation (i.e., the "seed") to develop sequences that are repeatable but have a characteristic of randomness. Control circuitry identifies and reports faults found during the test, depending upon the bits read from the memory and those expected from the particular pseudorandom sequence generated. Because there is a tendency for the high order address lines to be exercised infrequently during sequential addressing, a second, independent, address function is added whereby during successive address sweeps, each address is selected once and only once. The address function is parameterized by the size of the memory, to cause substantial activity on all address lines.

A further object of the invention, therefore, is to provide a method of and system for exercising all order address lines substantially equally in memory fault testing.

Another object is to provide uniform addressing in a fast random access memory testing algorithm.

Still other objects and advantages of the present invention will become readily apparent to those skilled in this art from the following detailed description, wherein I have shown and described only the preferred embodiment of the invention, simply by way of illustration of the best mode contemplated by me of carrying out my invention. As will be realized, the invention is capable of other and different embodiments, and its several details are capable of modifications in various obvious respects, all without departing from the invention. Accordingly, the drawing and description are to be regarded as illustrative in nature, and not as restrictive.

BEST MODE FOR PRACTICING THE INVENTION

Figure 2:
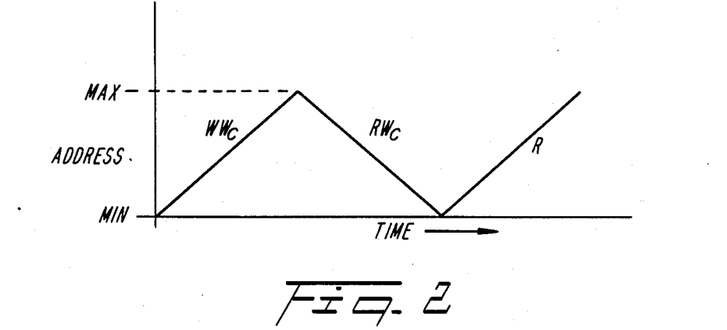
FIG. 2 is a graph showing a short RAM test algorithm, in accordance with the invention.

A fast march type RAM system test in accordance with one aspect of the invention comprises a five cycle test having three "sweeps" as follows, wherein W is a "write", Wc is a "write the complement of the data previously written into the designated cell" and R is a "read data": going up in addresses WWc, going down RWc and going up R. A "sweep" is defined herein as a sequence of cell addresses from one boundary address to another; a "cycle" is any access, read or write, of each cell during a sweep. Thus, a "1" or "0" and then its complement are written successively into all memory cells as the cells are up addressed. As the memory is down addressed, the contents of the cells are read and then complemented. Any difference between the cell contents that are read and those expected is indicative of a fault. Finally, as the memory is up addressed, the contents of the cells are again read and compared with expected contents. There are thus three "sweeps" of cell addresses, two of which perform two cycles of each cell in the sequence as shown in FIG. 2. Hence, each cell is accessed a total of five times. It is pointed out, however, that the first "write" cycle of the sequence is optional, and could be eliminated to provide a four cycle test sequence. The initial "W" cycle is preferable, however, to ensure that the memory system cells are capable of making both 0 to 1 and 1 to 0 transitions.

If all bits of a fixed sequence are successively written into all memory cells, then complemented, etc., using the test algorithm of FIG. 2 in accordance with one aspect of the invention, all stuck cells and all aliased cells are located. Certain classes of faults, however, particularly those associated with decoder faults, tend to be missed. Thus, in accordance with another aspect of the invention, a fast march test of the type described above is modified by writing random bits into successive memory cells, rather than writing the same bits or a fixed sequence of bits into the cells, during each addressed sweep. The test, written in pseudocode is as follows, where Z(X) is the random function and $\overline{Z}/$ is its complement:

for a = 0 to N−1 do

MEMORY[a] = $\overline{Z(a)}$

MEMORY[a] = Z(a)
end for for a = N−1 downto 0 do
   if MEMORY[a] ≠ $\overline{Z(a)}$ then error -continued

```
    MEMORY[a] = Z(a)

end for for a = 0 to N−1 do
    if MEMORY[a] ≠ Z(a) then error
end for
```

Thus, initially, the memory is up addressed (a=0 to N−1), random bits are written into successive memory cells, and then the complements are written into the cells. Next, as the memory is down addressed, i.e., addressed successively between memory locations N−1 and 0, the memory cell contents are read and compared with expected contents. If there is a difference, an error message is generated. The contents of the memory cells are complemented as the memory is down addressed, and finally, as the memory is up addressed, the memory contents are read and compared with expected contents. An error message is generated in response to any discrepancy.

This test identifies all stuck-at faults and all aliases (both normal and inverted) between bits that are in different addresses. Consequently, the test detects all stuck data register bits, stuck address bits and all decoder faults that cause aliasing, all 0s or all 1s in the affected addresses. The test further detects virtually all faults that affect a number of addresses, including all remaining decoder faults, since they affect an entire row or column, shorted or pattern sensitive data register bits, and address to data shorts. Data or address to control line shorts probably are identified. The test, during any given run, has at least a 75% chance of finding any static coupling fault and a 25% chance of finding any dynamic coupling fault or any AND/OR type multiple access fault affecting a single pair of cells that are in different addresses. The test has a 50% chance of identifying static coupling or aliases between cells in the same word. Furthermore, any run of the test made with a different seed to initiate a unique random bit sequence, probably will locate any errors missed during an earlier run.

Consider, for example, the case of multiple access faults of the AND/OR type resulting from a bad decoder. Such a fault will cause read commands directed to cells in some column, e.g., X, to return contents of the addressed cell AND'd (OR'd) with the contents of the corresponding cell in some other column, e.g., Y. This fault may be asymmetrical, so that cells in column Y read correctly. In certain cases the fault is detected only when Z(a) takes on particular values for the affected cells, i.e., the cell from column X is a 1 while the corresponding cell in column Y is a 0. Thus, if an AND/OR fault of this type were to affect only a single pair of cells, it would be detected with only a 25% probability. If, however, a column has 32 cells, the probability of this combination never occurring and hence of no error being reported is $(1−0.25)^{32} = 0.0001004$.

To confirm that the test described above reports an error when there are any number of cells aliased, two cases must be considered.

1. $Z(i) = Z(j)$ for all cells i and j in the alias group. The second phase of the test, in accordance with the invention, consisting of the steps $R_{Z(i)}\overline{W_{Z(i)}}$ will, on access of the second cell in the group, e.g., $M_j$, find it to be the wrong value since the content read will be $\overline{Z(i)}$, because of the $\overline{W_{Z(i)}}$ operation, while it is expected to be $Z(j) = Z(i)$.

2. $Z(i) \neq Z(j)$ for some cells i and j in the aliased group of cells. The final phase of the test finds all cells in the group to contain the same data, whereas at least some of them should contain opposite values.

A similar argument shows that even "inverted aliasing", wherein both reads and writes become inverted on their way to the "real" aliased cells, is always detected.

Open row lines, many decoder faults, and bad sense amplifiers all make a number of cells appear "stuck-at" and hence are detected.

Stuck-at address register bits, many decoder faults and shorted together row or column lines, cause aliasing of cells, and are detected or shown above.

The remaining types of faults are more complex. The performance of the test in accordance with the invention with respect to several types of faults, is, however, described below.

Defective Row Encoder; Missing Factor

This type of fault occurs when a row decoder, essentially an AND gate, has one input that is continually asserted instead of being controlled by an appropriate address line. Let the significance of the affected line be $2^k$. Without loss of generality, assume that the affected line enters the gate uninverted. The affected gate will assert its output both when it should, and at a set of addresses derived from subtracting $2^k$ from the addresses of cells controlled by the affected gate, i.e., for all cells along some other row, identified herein as row A; cells controlled by the affected gate are in row B.

Reads and writes of cells in row B operate correctly. Writes to a cell in row A write both the correct address, e.g., $M_a$, into the corresponding cell in row B, $M_{(a+2^k)}$. Reads of a cell in row A result in the contents of both cells being somehow combined, and in the result being both presented at the output of the memory and written back into both cells. Typically, the combination is an AND operation in the one-half of the memory where lack of charge represents a 1 and is an OR operation in the one-half of the memory where the presence of charge represents a 1.

Figure 3:
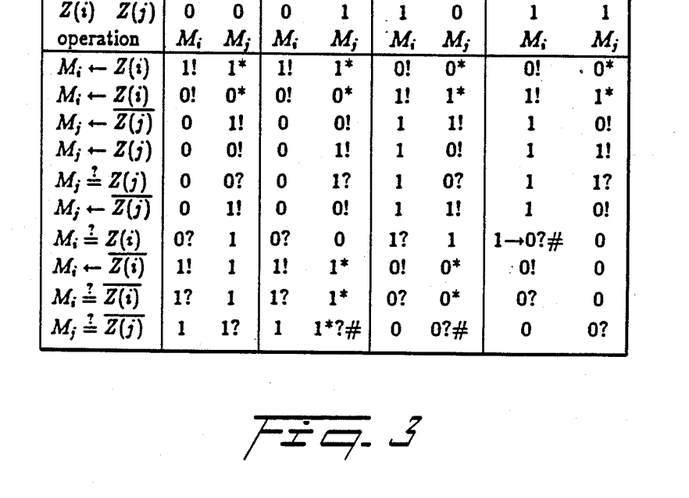
FIGS. 3-5 are tables showing the results of fault testing in accordance with the invention, in connection with three different fault types.

The AND is first considered, with reference to the table in FIG. 3, which traces the operation of the RAM test, in accordance with the invention, for all four possible assignments of values to Z(i) and Z(j), where $j = (i+2^k)$. A "!" denotes the memory cell as the target of a write, a "?" denotes the memory cell as the target of a read, a "*" denotes that an erroneous value has been read or that an erroneous value has been written into a cell, and a "#" indicates that an error is reported. The symbol "1→0", for example, indicates that a cell should have contained a 1, but a read operation on the cell set its content to a 0.

As shown in the table, an error is reported in three of the four possible assignments of values to Z(i) and Z(j). Since these values are chosen randomly, such a fault that effects only a single pair of cells would be detected with a probability P=0.75. However, this fault will, in fact, affect all pairs of cells in row A and row B. Thus, if N is the number of cells in a row and Q is a probability that the fault is not detected in a single pair of cells, $Q = 1 − P = 0.25$. Since the assignment of values to cells is chosen randomly, however, the event of the fault occurring in one pair of cells is independent of the corresponding event in any other pair of cells along the row. Hence, the probability of all the cells along the row not detecting a fault is $Q^N$. For example, for a 64K memory, $N=256$ and $Q^N=0.25^{256}=7.45\times10^{-155}$. Even for a 1K memory, $N=32$ and $Q^N=0.25^{32}=5.42\times10^{-20}$. This is a substantial improvement over the probability that an error will not be detected during any test sequence using a fixed sequence pattern, as opposed to a random pattern as in the invention.

Where the contents of the affected cells are erroneously combined in an OR operation, the analysis is the same, except that the faults are detected in cases wherein $Z(i)$ and $Z(j)$ are 00, 10 and 01. The results are also the same when a defective decoder appears earlier in the march sequence, rather than later as it does here.

Defective Column Selector

Assuming, for example, that the column B selector is defective whereby although all writes are operative, there is some other column, A, such that when a read is directed to a cell in it, data from the corresponding cell in column B are combined and the result is presented at the output of the memory. Data in the actual cells thus are unaffected. The combining may be either via an AND or an OR operation, depending upon the design of the memory.

Figure 4:
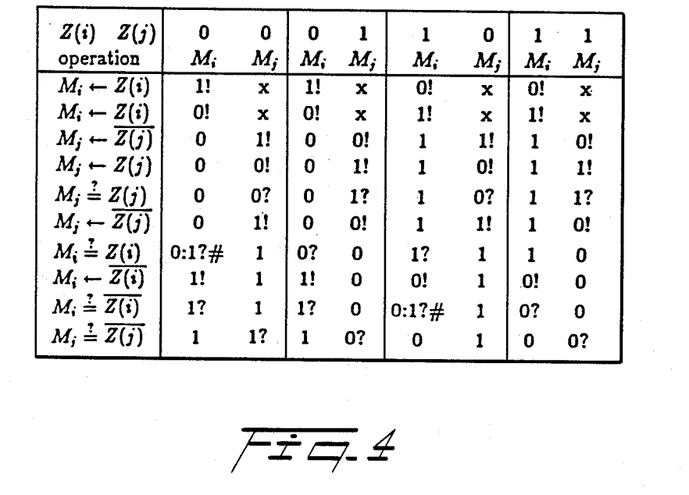

Concerning first the case where there is an OR combination, the analysis is similar. The symbols used in FIG. 4 are the same as those defined above. In addition, "0:1?" indicates that the addressed cell actually contains a 0, but the cell, as read, returned a 1 due to the effect of some other cell.

As noted in FIG. 4, errors are reported in 2 out of the 4 possible assignments of values to $Z(i)$ and $Z(j)$. Hence, $P=Q=0.5$, and the probability that no errors are reported for an entire column, for $N=256$, is $0.5^{256}=8.64\times10^{31\ 78}$; for $N=32$, the probability is $2.32\times10^{-10}$.

Dynamic Coupling Faults

A dynamic coupling fault occurs when a particular transition, e.g., from 0 to 1, of one cell sets (or clears) another cell. This fault might occur due to capacitive coupling between cells.

Figure 5:
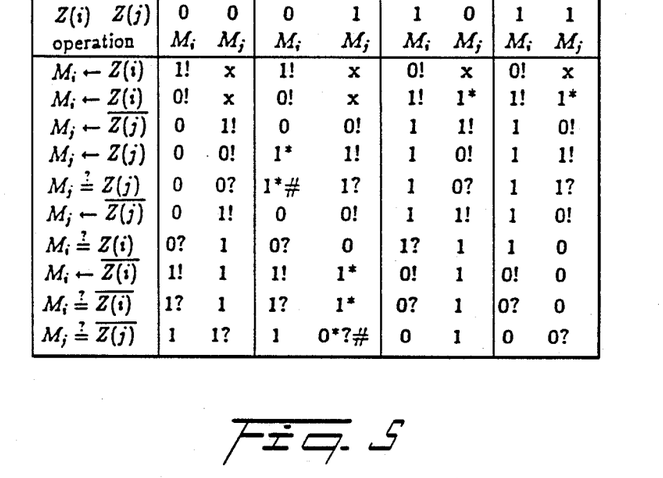

With reference to the table of FIG. 5, it is assumed that due to dynamic couplings, cell j is set in response to a transition by cell i from 0 to 1. An error is detected in only one case, namely, when $Z(i)=0$ and $Z(j)=1$. Hence, $P=0.25$ and $Q=0.75$. The probability that a whole row of such faults would be undetected is $Q^N$. Thus, for a 1K memory, where $N=32$, the probability is $Q^N=0.75^{32}=0.0001004$.

It is thus clear that the short RAM test, using a probabilistic march, identifies virtually all species of memory faults with a high probability.

Preferably, the data written into the cells and thereafter read are generated randomly by a reversible pseudorandom generator. A pseudorandom generator is a data generator of a type wherein successive data have the characteristic of randomness, but the sequence length of the data is fixed, although typically long, and is repeatable as a function of a key or "seed" that initiates the generator. Reversible pseudorandom generators are well known, and typically are of a hardware type, formed by a number of recirculating shift registers, as described, for example, in Dixon, Spread Spectrum Systems, John Wiley & Sons, Inc., 1976 at Sec. 3.2, "(Linear Code Generator Configurations)". Preferably, however, the pseudorandom code generator may be implemented by software as described below.

Thus, the code generator may comprise 32 parallel feedback shift register random number generators, implemented by software, generating a polynomial such as $X^{33}-X^{13}-1$, or possibly a higher order polynomial. Each bit goes through an identical cycle length of $2^{33}-1$ using the exemplary polynomial; the seed affects only the starting point. Although it might appear that the selection of the seed is arbitrary, I have determined through simulations that the better the quality of the seed, the better the generator is at passing statistical tests. In my experimentation the best results were obtained by piecing together words from the most significant byte (selected by masking with 0X7f800000) of the output of a Unix C library function rand ( ), which is based upon the statement in C programming language:

```
return ((randx = randx*1135152445 + 12345) &
    0X7fffffff).
```

Alternatively, the Unix C library function Random, modified to generate 32 bit values, may be used to generate the seed values. Thus, in this manner, the pseudorandom generator, software implemented, establishes an array 64 words long, called SHFTRG, with the lower 33 entries initialized with random numbers. Then, for sequencing up addresses, Z at each cycle is computed in C programming language as follows:

```
Z = SHFTRG[(i + 33) & 0X3F] = SHFTRG[(i + 13) &
    0X3F] SHFTRG[i & 0X3F]
For sequencing down, compute:
SHFTRG[i & 0X3F] = SHFTRG[(i + 13) & 0X3F]
    (Z = SHFTRG[(i + 33) & 0X3F])
```

Nearly uniform sampling of the memory cells can be implemented by stepping through the addresses with a step size that is about the golden ratio, $$G = (\sqrt{5} - 1)/2 = .618033989,$$

times the memory size. Uniform addressing of the memory is also desired because sequential addressing tends to emphasize activity on the low order address lines, whereas activity is relatively infrequent on the high order lines. Preferably, the memory should be addressed with an address function A that exercises all memory bits essentially uniformly. Such a function must ensure that during each sweep or run of the test, each address of the memory is accessed once and only once.

Thus, in accordance with another aspect of the invention, an address function $A(i)$ is developed to exercise all the address lines equally while addressing each memory cell exactly once. The memory test algorithm is thus modified as follows:

```
for i = 0 to N−1 do

MEMORY[A(i)] = Z(i)

MEMORY[A(i)] = Z(i)
end for for i = N−1 downto 0 do
```

```
            -continued
   if MEMORY[A(i)] ≠ Z(i) then error

MEMORY[A(i)] = Z(i)̄ end for for i = 0 to N−1 do if MEMORY[A(i)] ≠ Z(i)̄ then error end for
```

Selection of a suitable address function is described in detail in Knuth, The Art of Computer Programming Vol 3: Sorting and Searching pages 511–513, as Fibonacci hashing. The address function, A, must be fast to evaluate. Thus, in accordance with the invention, $A(i)=k*i \bmod N$, where N is the memory size and k is relatively prime to N. If N is a power of 2, k can be any odd number. Alternatively, for more generality, k may be a number approximately equal to the golden ratio times the memory size, and relatively prime to the memory size. This causes the first few addresses probed to be almost uniformly spread throughout the memory address space. Subsequent addresses gradually fill in the memory "holes" until the entire memory has been probed.

To find a suitable k, compute the term "$k=G*N$". Then k is adjusted to be relatively prime to N. If N is a power of two, k is forced to be odd. A general technique for arbitrary memory sizes is shown in the following C code:

```
   while (gcd(k, N!=k) k++
   where gcd is the function:

{                unsigned long gcd(a,b)
                    unsigned long a,b;
                      unsigned long temp;
                      while (a ≠ 0) {
                        temp = a;
                        a = b % a;
                        b = temp;
                      };
                      return(b);
   }
```

Figure 6:
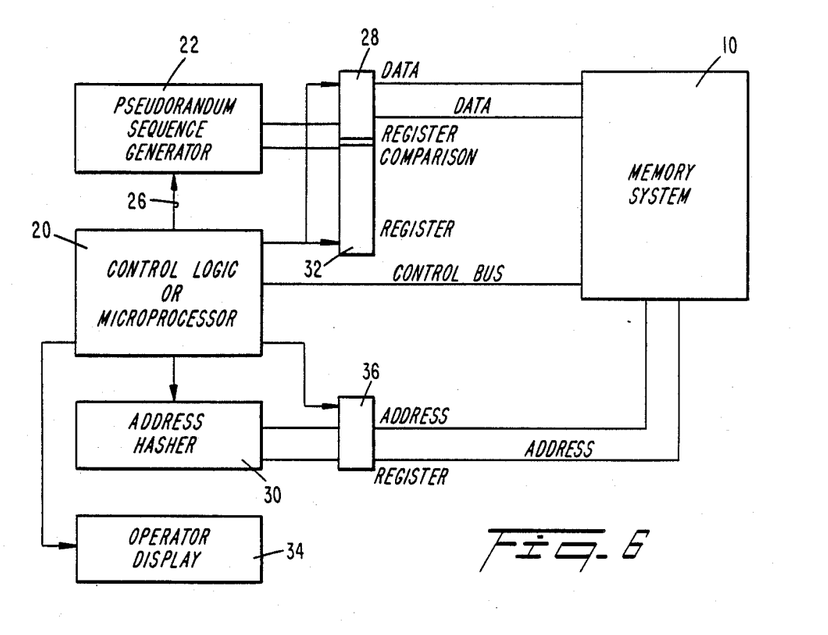
FIG. 6 is a block diagram of a system for implementing the invention.

FIG. 6 is a simplified schematic diagram showing an implementation of the fast RAM test system using a pseudorandom generator 22 constructed preferably of software as described above, but which alternatively may be hardware implemented. Control sequencer 20, which preferably is a conventional microprocessor, is connected in circuit with pseudorandom generator 22 for writing random data to and reading the data from the memory system under test 10, in accordance with the probabilistic march test described above. Microprocessor 20 applies a key or "seed" to pseudorandom data generator 22 over line 26, and outputs from the generator a first random word to be stored in data register 28. The microprocessor 20 also applies to address hasher 30, developing the address function, a first address representing the lower boundary address in an address sequence to be applied by address register 36 to the memory system 10. The first pseudorandom word developed by generator 22 is thus written into the memory system 10 at the initial address specified by hasher 30 as a function of the lower boundary address of the sequence. Microprocessor 10 then complements the word and writes it again to the addressed word in the memory system under test. This process is repeated for successive addresses of the sequence, up to the upper boundary address, to complete the first sweep shown in FIG. 2.

Microprocessor 20 next controls the pseudorandom sequence generator 22 to repeat the sequence of random words in reverse order while the memory system 10, through hasher 30, is down addressed, i.e., the addresses are sequenced between the upper and lower boundary addresses. Words read from the memory system data register 28 are compared with corresponding pseudorandom words from generator 22 in register 32. Any differences between the data read and the corresponding data developed by generator 22 is indicative of a memory fault to be displayed at 34. Following each read during this sweep, the words previously written into cells of the memory system under test are complemented, completing the second sweep shown in FIG. 2.

Finally, microprocessor 20 controls pseudorandom sequence generator 22 to apply the initial sequence of pseudorandom words to data register 28 while the corresponding words in memory system 10 are read, stored in register 32, and compared. Any differences between the data read and the corresponding data developed by generator 22 is indicative of a memory fault, to be displayed at 34.

Because the sequence of data generated by pseudorandom generator 22 is a function of the seed data initially applied to the generator by microprocessor 20, the same test can be successively applied to memory 10 to develop a "memory signature" for display on 34. This enables a technician, viewing the display 34, to determine whether the fault profile for each memory chip is stable, and to make a determination of the quality of the memory system. Furthermore, it is possible, through either the development of skill by the technician or by software analysis, to determine from the profile a fault hypothesis. If all the errors involve a single chip of a system of chips being tested, for example, that chip is likely at fault. If all the chips being tested display a similar fault profile, but the profiles indicate that faults occur only at odd addresses, however, then a stuck address line likely is the cause.

Thus, by processing random bits within a fast RAM test, in accordance with the invention, most types of memory system faults are identified with a high probability and in a short period of time. The probability that all faults will be identified can further be increased by repeating the probabilistic march test using a different seed. In addition, the address function, incorporated within the test, tends to exercise all high order address lines equally, and this further improves the likelihood of identifying faults.

In this disclosure, there is shown and described only the preferred embodiment of the invention, but, as aforementioned, it is to be understood that the invention is capable of use in various other combinations and environments and is capable of changes or modifications within the scope of the invention concept as expressed herein.

I claim:

1. A method of fault testing a random access memory system having a plurality of memory cells, each cell being nominally uniquely addressable, comprising the steps of writing a random sequence of bits successively into the cells through a first sequence of cell addresses;

through a second sequence of cell addresses reading and then complementing the contents of the cell; through a third sequence of cell addresses opposite the second sequence reading the contents of the cells; and comparing contents read from the cells with expected contents of the cells addressed in the second and third address sequences, respectively, to detect differences, and in response, identifying memory faults.

2. The method of claim 1, including the step of addressing said memory cells using a uniformly spread sequence of cell addresses.

3. The method of claim 1, including generating reversible pseudorandom bit sequences, wherein said step of writing includes writing using a forward pseudorandom bit sequence, and the step of comparing includes comparing contents read from said cells with a reverse pseudorandom bit sequence.

4. A method of fault testing a random access memory system having a plurality of memory cells, each cell being nominally uniquely addressable, comprising the steps of writing a random sequence of bits, then their complements, successively into the cells through a first sequence of cell addresses; through a second sequence of cell addresses opposite the first sequence reading the contents of the cells and then complementing the contents; through a third sequence of cell addresses opposite the first sequence, reading the contents of the cells; and comparing the contents read from said cells with expected contents of the cells addressed in the second and third address sequences, respectively, to detect differences, and in response, identifying any memory faults.

5. The method of claim 4, including the step of addressing said memory cells using a uniformly spread sequence of cell addresses.

6. The method of claim 4, including generating reversible pseudorandom bit sequences, wherein said step of writing includes writing using a forward pseudorandom bit sequence, and the step of comparing includes comparing contents read from said cells with a reverse pseudorandom bit sequence.

7. A method of fault testing a random access memory system having a plurality of memory cells, each cell being nominally uniquely addressable, comprising the steps of (a) writing a random sequence of bits successively into the cells, then complementing the bits, through a first sequence of cell addresses; (b) through a second sequence of cell addresses opposite the first sequence reading the contents of the cells, then complementing the contents; (c) through the first sequence of cell addresses writing said random bits successively into the cells and then reading said cells; (d) comparing contents read from the cells in steps (b) and (c) with random bits expected to be read from those cells in the second and first address sequences, respectively, and, in response, identifying any memory faults.

8. The method of claim 7, including the step of addressing said memory cells using a uniformly spread sequence of cell addresses.

9. The method of claim 7, including generating reversible pseudorandom bit sequences, wherein said step of writing includes writing using a forward pseudorandom bit sequence, and the step of comparing includes comparing contents read from said cells with a reverse pseudorandom bit sequence.

10. A method of fault testing a random access memory system having a plurality of memory cells, each cell being nominally uniquely addressable, comprising the steps of generating a random sequence of bits, writing the random sequence of bits successively into the cells through a first sequence of cell addresses substantially uniformly spread using "golden ratio" spreading of addresses of said cells, reading contents of the cells through a second sequence of cell addresses different from the first address sequence but containing all the addresses of the first address sequence, comparing the read contents with expected contents of the cells in the second address sequence and, in response, identifying any memory faults.

11. The method of claim 10, wherein said sequence of random bits comprises a pseudorandom bit sequence.

12. The method of claim 11, wherein said pseudorandom bit sequence is reversible and said expected contents of said cells are derived from the reverse pseudorandom bit sequence.

13. The method of claim 11, including the step of controlling said sequence of pseudorandom bits using a "seed", and repeating said method using a different seed.

14. Apparatus for fault testing a random access memory system having a plurality of memory cells, each being nominally uniquely addressable, comprising:
reversible pseudorandom bit generation means for generating a reversible pseudorandom bit sequence;
means for addressing the cells of said memory through selectively first and second address sequences;
means for writing said psuedorandom bit sequence into said memory through said first address sequence;
means for reading the contents of said memory through said second address sequence while controlling said pseudorandom bit generation means to generate said pseudorandom bit sequence in reverse, and for comparing said contents read with expected contents of cells in said second address sequence obtained from said pseudorandom bit sequence in reverse to detect any differences;
means responsive to differences detected by said comparing means for identifying memory faults; and
means for indicating said faults.

15. The apparatus of claim 14, wherein said indicating means includes a visual display.

16. The apparatus of claim 14, wherein said generating means comprises a pseudorandom bit generator.

17. The apparatus of claim 14, wherein said addressing means includes means for generating a substantially uniform sequence of cell addresses.

18. Apparatus for fault testing a random access memory system having an array of memory cells, comprising:
means for generating a random sequence of bits;
means for addressing cells of said array with selectively first and second address sequences;
processor means for
(1) writing said random sequence of bits successively into the cells and then complementing the bits through said first address sequence;
(2) through the second sequence of cell addresses reading the contents of said cells and comparing said contents with expected contents of the cells in said second address sequence to detect differences, then complementing the contents;

(3) through said first sequence of addresses reading contents of said cells and comparing said contents with expected contents of the cells in said first address sequence to detect differences; and (4) in response to said differences identifying memory faults; and means for indicating said faults.

19. The apparatus of claim 18 wherein said indicating means includes a visual display.

20. The apparatus of claim 18, wherein said generating means comprises a pseudorandom bit generator.

21. The apparatus of claim 18, wherein said addressing means includes means for generating a substantially uniform sequence of cell addresses.

22. The apparatus of claim 18, wherein said generating means comprises means for generating reversible pseudorandom bit sequences, and said processor means includes means for deriving said expected contents of said cells from a reverse pseudorandom sequence of bits generated by said generating means.

23. Apparatus for fault testing a random access memory system having a plurality of memory cells, each cell nominally being uniquely addressable, comprising:

means for generating a pseudorandom bit sequence;

means for generating selectively first and second substantially uniform sequences of cell addresses;

means for writing said random bit sequence into said cells through said first address sequence;

means for reading the contents of said cells through said second address sequence and for comparing said contents read with said pseudorandom bit sequence; and means responsive to said comparing means for indicating any memory faults.

24. The apparatus of claim 23, including means for controlling a "seed" of said pseudorandom bit sequence.

* * * * *